United States Patent [19]

Lambert

[11] 4,303,838
[45] Dec. 1, 1981

[54] MASTER-SLAVE FLIP-FLOP CIRCUITS

[75] Inventor: Kenneth W. Lambert, Halesowen, England

[73] Assignee: Lucas Industries Limited, Birmingham, England

[21] Appl. No.: 38,859

[22] Filed: May 14, 1979

[30] Foreign Application Priority Data

May 31, 1978 [GB] United Kingdom ............... 24847/78

[51] Int. Cl.³ ............................................ H03K 3/289
[52] U.S. Cl. ................................ 307/272 A; 307/288; 307/362; 328/206
[58] Field of Search ............... 307/362, 247 A, 272 A, 307/291, 288; 328/206

[56] References Cited

U.S. PATENT DOCUMENTS

| | | | |
|---|---|---|---|
| 3,622,810 | 11/1971 | Sasaki ............................. | 307/272 A |
| 3,818,250 | 6/1974 | Reed et al. ...................... | 307/362 X |
| 4,188,547 | 2/1980 | Fox ................................. | 307/362 X |

Primary Examiner—John Zazworsky
Attorney, Agent, or Firm—Holman & Stern

[57] ABSTRACT

A d.c. triggered master-slave flip-flop circuit including a master flip-flop with a capacitive delay means at its input, and a slave flip-flop having its input connected to the output of the master flip-flop. A capacitive delay means is connected at the input of the slave flip-flop. The slave flip-flop controls the connections at the input of the master flip-flop in known manner. The two capacitive delay means, serve to make each flip-flop circuit immune to noise pulses and also eliminate multiple triggering caused by contact bounce when the circuit is controlled by mechanical contacts.

2 Claims, 1 Drawing Figure

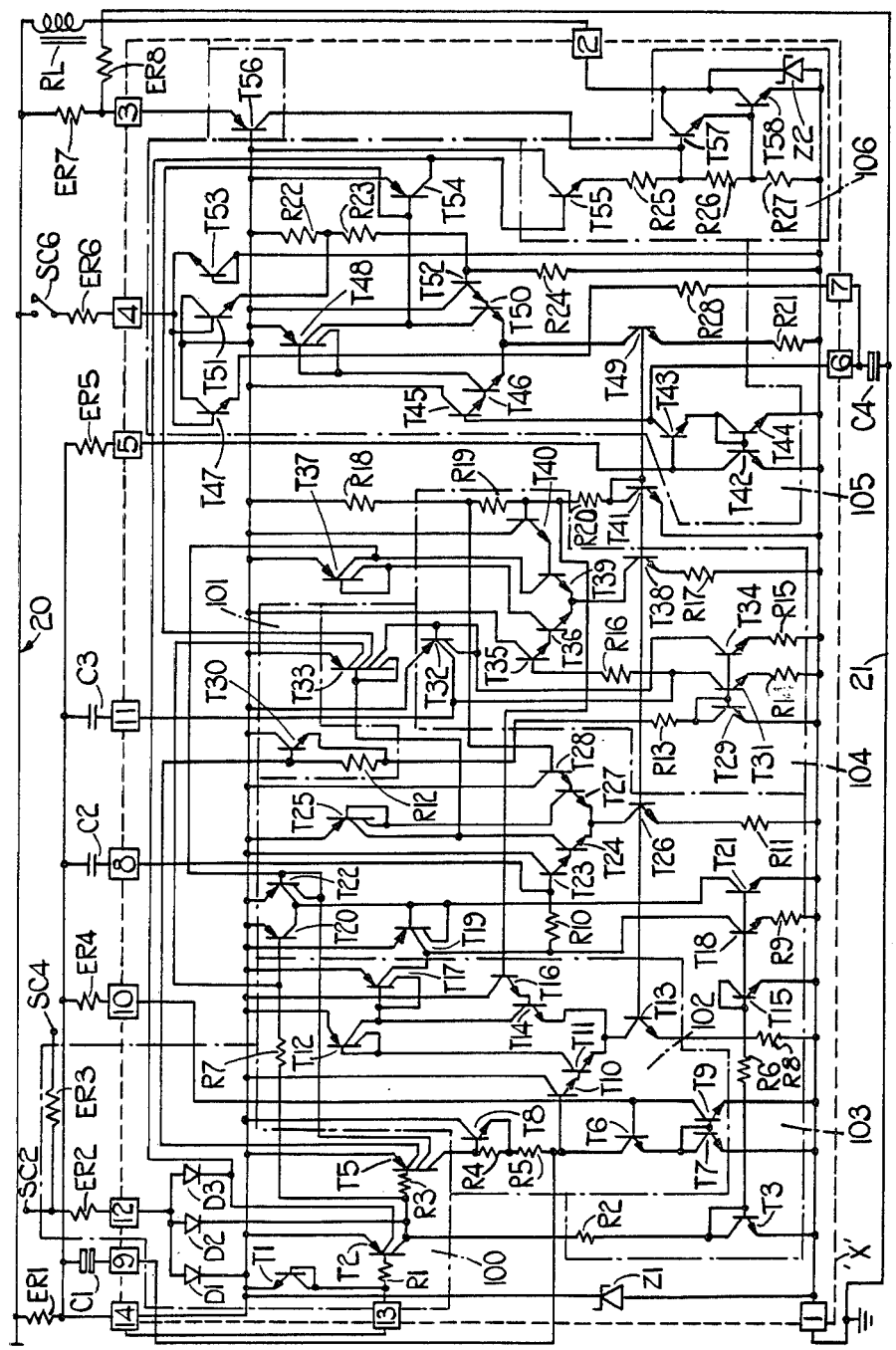

MASTER-SLAVE FLIP-FLOP CIRCUITS

This invention relates to master-slave flip-flop circuits.

Two basic types of flip-flop circuits are known, namely pulse triggered flip-flop circuits and d.c. triggered flip-flop circuits. Where it is required to realise a master-slave flip-flop in integrated circuit form utilizing a minimum number of external bulky components (particularly capacitors) it is considered most practicable to utilize d.c. triggered flip-flop circuits because pulse triggered types require external differentiating components.

Generally speaking, however, d.c. triggered flip-flop circuits are sensitive to power supply noise, and where connected to mechanical contacts for triggering, can also suffer from multiple operation as a result of contact bounce.

It is an object of the invention to provide a d.c. triggered master-slave flip-flop circuit in which these disadvantages are at least partially overcome.

In accordance with the invention there is provided a d.c. triggered master-slave flip-flop circuit comprising a master flip-flop circuit having an input terminal the voltage at which determines the state of the master flip-flop circuit, means providing positive feedback from the output to the input of the master flip-flop circuit, a slave circuit having an input connected to the output of the master flip-flop circuit and controlling the mode of connection of the master flip-flop circuit to a signal source, and capacitive delay means at the input of each of the master flip-flop circuit and the slave circuit.

An example of the invention is shown diagrammatically in the accompanying drawing which shows the circuit of a master-slave flip-flop circuit applied to the control of a vehicle windscreen wiper motor.

The components shown within the broken line 'X' in the drawing are incorporated in an integrated circuit device, the remaining components being external to the printed circuit package. The circuit shown fulfills substantially the same function as the circuit described in our U.K. Patent Application No. 28418/76.

Dealing firstly with the integrated circuit internal components, these include an npn transistor $T_1$ which has its emitter connected to a pin 14 of the package and its collector connected to its base and to a pin 13 of the package. The pin 14 is connected to the cathode of a zener diode $Z_1$, the anode of which is connected to pin 1 of the package. Pin 13 is connected by a resistor $R_1$ to the base of a pnp transistor $T_2$ with its emitter connected to pin 14 and with two collectors one of which is connected by a resistor $R_2$ to the collector and base of an npn transistor $T_3$, the emitter of which is connected to the pin 1. This collector of transistor $T_2$ is also connected to the cathode of a diode $D_2$ which has its anode connected to pin 12 of the package. Another diode $D_1$ connects pin 12 to pin 14 and yet another diode $D_3$ has its anode connected to pin 12 and its cathode connected to the other collector of transistor $T_2$.

The cathode of diode $D_2$ is connected by a resistor $R_3$ to the base of a pnp transistor $T_5$ the emitter of which is connected to pin 14. The transistor $T_5$ has three collectors a first of which is connected by two resistors $R_4$, $R_5$ in series to the collector of an npn transistor $T_6$, the base of which is connected to pin 10 of the package. The emitter of transistor $T_6$ is connected to the collector and base of an npn transistor $T_7$ the emitter of which is connected to the pin 1. The collector of transistor $T_6$ is also connected to pin 9 of the package. The first collector of transistor $T_5$ is connected to the base of an npn transistor $T_8$ the emitter of which is connected to the junction of the resistors $R_4$ and $R_5$ the collector of transistor $T_8$ being connected to pin 14. The base of transistor $T_6$ is also connected to the collector of an npn transistor $T_9$, the base of which is connected to the base of transistor $T_7$ and the emitter of which is connected to pin 1.

The collector of transistor $T_6$ is also connected to the base of an npn transistor $T_{10}$ the collector of which is connected to pin 14 and the emitter of which is connected to the base of an npn transistor $T_{11}$. The collector of transistor $T_{11}$ is connected to the base and one of two collectors of a pnp transistor $T_{12}$, the emitter of which is connected to pin 14. The emitter of transistor $T_{11}$ is connected to the collector of an npn transistor $T_{13}$ the emitter of which is connected by a resistor $R_8$ to the pin 1. The emitter of transistor $T_{11}$ is also connected to the emitter of an npn transistor $T_{14}$, the collector of which is connected to the other collector of the transistor $T_{12}$. The base of transistor $T_{14}$ is connected to the emitter of an npn transistor $T_{16}$, the collector of which is connected to pin 14.

A resistor $R_6$ connects the base and collector of the transistor $T_3$ to the base and collector of an npn transistor $T_{15}$, the emitter of which is connected to the pin 1, and also to the base of two further npn transistors $T_{18}$ and $T_{21}$. The emitter of transistor $T_{18}$ is connected by a resistor $R_9$ to pin 1 and the emitter of transistor $T_{21}$ is connected directly to pin 1.

The collector of transistor $T_{18}$ is connected to one collector of a two collector pnp transistor $T_{17}$ which has its base connected both to its own other collector and to said other collector of transistor $T_{12}$, the emitter of the transistor $T_{17}$ being connected to pin 14. In addition the collector of the transistor $T_{18}$ is connected to one of two collectors of a pnp transistor $T_{19}$, the base of which is connected to its other collector and to the collector of transistor $T_{21}$. The emitter of transistor $T_{19}$ is connected to the pin 14, and its base is connected to the collector of a pnp transistor $T_{20}$ and to one of two collectors of a pnp transistor $T_{22}$, the base of which is connected to its other collector. The emitters of both transistors $T_{20}$, $T_{22}$ are connected to the pin 14. The base of transistor $T_{20}$ is connected by a resistor $R_7$ to the cathode of the diode $D_2$ and the base of the transistor $T_{22}$ is connected to one of the collectors of the transistor $T_5$.

Said one collector of the transistor $T_{19}$ is connected by a resistor $R_{10}$ to the base of an npn transistor $T_{23}$ which base is also connected to pin 8 of the integrated circuit package. The collector of transistor $T_{23}$ is connected to the pin 14 and its emitter is connected to the base of an npn transistor $T_{24}$. The collector of transistor $T_{24}$ is connected to one of two collectors of a pnp transistor $T_{25}$ the emitter of which is connected to pin 14 and the base of which is connected to its other collector. The emitter of transistor $T_{24}$ is connected to the collector of an npn transistor $T_{26}$, the emitter of which is connected by a resistor $R_{11}$ to pin 1.

The other collector of transistor $T_{25}$ is also connected to the collector of an npn transistor $T_{27}$ which has its emitter connected to the emitter of transistor $T_{24}$. The base of transistor $T_{27}$ is connected to the emitter of an npn transistor $T_{28}$, the collector of which is connected to pin 14.

The transistors $T_3$, $T_{15}$, $T_{18}$, $T_{19}$, $T_{20}$, $T_{21}$, $T_{22}$ $T_{23}$, $T_{24}$, $T_{25}$, $T_{26}$, $T_{27}$ and $T_{28}$, the resistors $R_2$, $R_6$, $R_7$, $R_9$, $R_{10}$ and $R_{11}$ and a further transistor $T_{33}$ (yet to be described in detail) form the master flip-flop circuit as will be explained in more detail hereinafter.

An npn transistor $T_{29}$ has its emitter connected to the pin 1 and its base connected to its own collector which is connected by a resistor $R_{13}$ to the emitter of a transistor $T_{30}$. The base of transistor $T_{30}$ is connected to one collector of the transistor $T_5$ and is also connected by a resistor $R_{12}$ to its own emitter. The collector of transistor $T_{30}$ is connected to pin 14. The base of transistor $T_{29}$ is connected to the base of an npn transistor $T_{31}$ which has its emitter connected to pin 1 by a resistor $R_{14}$. The collector of transistor $T_{31}$ is connected to pin 11 of the integrated circuit package and also to one of two collectors of a pnp transistor $T_{32}$. The other collector of transistor $T_{32}$ is connected to its own base and to the collector of an npn transistor $T_{34}$, the emitter of which is connected to pin 1 by a resistor $R_{15}$ and the base of which is connected to the base of transistor $T_{29}$. The base of transistor $T_{32}$ is also connected to one of four collectors of the pnp transistor $T_{33}$ forming the output transistor of the master flip-flop circuit. The emitters of transistors $T_{32}$ and $T_{33}$ are connected to pin 14. Another collector of transistor $T_{33}$ is connected to the base thereof which is also connected to the collector of the transistor $T_{25}$. Yet another collector of the transistor $T_{33}$ is connected by a resistor $R_7$ to a collector of the transistor $T_2$.

Said one collector of transistor $T_{32}$ is connected by a resistor $R_{16}$ to the base of an npn transistor $T_{35}$ which has its collector connected to pin 14 and its emitter connected to the base of an npn transistor $T_{36}$. The collector of transistor $T_{36}$ is connected to the base and one collector of a two collector pnp transistor $T_{37}$, the emitter of which is connected to pin 14. The other collector of transistor $T_{37}$ is connected to the base of the transistor $T_{22}$.

The emitter of transistor $T_{36}$ is connected to the collector of an npn transistor $T_{38}$ which has its emitter connected by a resistor $R_{17}$ to the pin 1 and its base connected to the bases of transistor $T_{13}$ and $T_{26}$. The emitter of transistor $T_{36}$ is also connected to the emitter of an npn transistor $T_{39}$, the collector of which is connected to said other collector of the transistor $T_{37}$ and the base of which is connected to the emitter of an npn transistor $T_{40}$. The collector of transistors $T_{40}$ is connected to pin 14.

The transistors $T_{29}$, $T_{31}$, $T_{32}$, $T_{34}$, $T_{35}$, $T_{36}$, $T_{37}$, $T_{38}$, $T_{39}$ and $T_{40}$ together with resistors $R_{13}$, $R_{14}$, $R_{15}$, $R_{16}$ and $R_{17}$ form a slave flip-flop circuit, and transistor $T_{30}$ and resistor $R_{12}$ form a electronic switch for inhibiting operation of the slave flip-flop circuit in certain circumstances as will be explained hereinafter in detail.

Three resistors $R_{18}$, $R_{19}$ and $R_{20}$ are connected in series between pin 14 and the collector of an npn transistor $T_{41}$, the emitter of which is connected to pin 1 and the collector of which is connected to its base. The base of transistor $T_{41}$ is also connected to the bases of transistors $T_{13}$, $T_{26}$ and $T_{38}$ so that the latter act as constant current sinks. The resistors $R_{18}$, $R_{19}$ and $R_{20}$ provide reference voltages for the timer circuit and the two flip-flop circuits. The junction of resistors $R_{18}$ and $R_{19}$ is connected to the base of the junction of resistors $R_{19}$ and $R_{20}$ is connected to the bases of transistors $T_{16}$ of the timer circuit and $T_{40}$ of the slave flip-flop circuit.

An npn transistor $T_{42}$ has its emitter connected to the pin 1 and its collector connected to a pin 5 of the integrated circuit package. The collector of transistor $T_{42}$ is connected to the base of an npn transistor $T_{43}$, the emitter of which is connected to the base of transistor $T_{42}$ and to the collector and base of an npn transistor $T_{44}$. The emitter of transistor $T_{44}$ is connected to pin 1 and the collector of transistor $T_{43}$ is connected to pin 6 of the integrated circuit package.

The collector of transistor $T_{43}$ is also connected to the base of an npn transistor $T_{45}$, the collector of which is connected to pin 14 and the emitter of which is connected to the base of an npn transistor $T_{46}$. The collector of transistor $T_{46}$ is connected to the base and to one of two collectors of a pnp transistor $T_{48}$, the emitter of which is connected to pin 14. The emitter of transistor $T_{46}$ is connected to the collector of a transistor $T_{49}$ which has its emitter connected by a resistor $R_{21}$ to the pin 1 and its base connected to the collector of transistor $T_{41}$ so that it is biased to act as a constant current sink. The emitter of transistor $T_{46}$ is also connected to the emitter of an npn transistor $T_{50}$, the collector of which is connected to the other collector of transistor $T_{48}$ and the base of which is connected to the emitter of an npn transistor $T_{52}$. The collector of transistor $T_{52}$ is connected to the pin 14 and its base is connected by a resistor $R_{24}$ to pin 1 and by two resistors $R_{22}$, $R_{23}$ in series to the pin 14.

The junction of resistors $R_{22}$, $R_{23}$ is connected to the emitter of an npn transistor $T_{51}$, the collector of which is connected to pin 14 and the base of which is connected to a pin 4 of the integrated circuit package. The base of an npn transistor $T_{47}$ is also connected to pin 4, the collector of transistor $T_{47}$ being connected to pin 14 and its emitter being connected by a resistor $R_{28}$ to a pin 7 of the integrated circuit package. An npn transistor $T_{53}$ has its emitter connected to pin 4 and its collector and base connected to pin 1.

The collector of transistor $T_{50}$ is also connected to the base of a pnp transistor $T_{54}$, the emitter of which is connected to pin 14. The base of transistor $T_{54}$ is also connected to the remaining collector of the transistor $T_{33}$.

The transistors $T_{42}$ to $T_{54}$ together with resistors $R_{21}$, $R_{23}$ and $R_{28}$ and various external components (yet to be described) form an oscillator which is controlled by the master flip-flop circuit.

An npn transistor $T_{55}$ has its base connected to the collector of transistor $T_{54}$ and also to the cathode of the diode $D_3$. The collector of the transistor $T_{55}$ is connected to pin 14 and its emitter is connected by three resistors $R_{25}$, $R_{26}$ and $R_{27}$ in series to pin 1. The junction of resistors $R_{25}$ and $R_{26}$ is connected to the base of an npn transistor $T_{57}$, the collector of which is connected to a pin 2 of the integrated circuit package. The emitter of transistor $T_{57}$ is connected to the base of an npn transistor $T_{58}$ and also to the junction of resistors $R_{26}$ and $R_{27}$. The collector of transistor $T_{58}$ is connected to pin 2 and its emitter is connected to pin 1. A zener diode $Z_2$ has its cathode connected to pin 2 and its anode connected to pin 1.

The transistors $T_{55}$, $T_{57}$ and $T_{58}$ together with resistors $R_{25}$, $R_{26}$ and $R_{27}$ and zener diode $Z_2$ form the output stage of the integrated circuit.

A pnp transistor $T_{56}$ has its base connected to pin 14, its emitter connected to a pin 3 of the integrated circuit package and its collector connected to the base of transistor $T_{57}$. The transistor $T_{56}$ acts as a protective device, turning on the output transistors $T_{57}$ and $T_{58}$ in the event of an overvoltage condition.

The external components used in conjunction with the integrated circuit include a resistor $ER_1$ which connects pin 14 to a positive supply rail 20 so that when pin 1 is connected to the negative supply rail 21 (usually the vehicle chassis in the case of a road vehicle electrical system) the resistor $ER_1$ is in series with the zener diode $Z_1$ across the supply, thereby regulating the voltage on pin 14.

In the arrangement actually shown in the drawing pin 13 is linked externally to pin 14, but in one possible connection modes a resistor (not shown) is connected between these pins. Pin 12 is connected by a resistor $ER_2$ to a switch contact SC2 which is connected to another switch contact SC4 by a resistor $ER_3$. A resistor $ER_4$ connects pin 10 to pin 14. A capacitor $C_1$ connects pin 9 to pin 14 and two further capacitors $C_2$ and $C_3$ connect pins 8 and 11 to pin 14 and a resistor $ER_5$ connects pin 5 to pin 14 and a resistor $ER_6$ and a contact SC6 in series connect pin 4 to the supply rail 20. Two resistors $ER_7$ and $ER_8$ in series between the rails 20, 21 have their common point connected to terminal 3. Terminal 2 is connected via relay winding RL to the supply rail 20. Pins 6 and 7 are connected together and through a capacitor $C_4$ to the rail 21.

The contacts SC2 and SC4 are contacts of a conventional windscreen wiper control switch operable in known manner such that movement of the switch control member in one direction connects contact SC2 to the rail 20 with a detent action for normal windscreen wiper operation and movement of the control member in the opposite direction causes contact SC2 to be connected to rail 20 with no detent action for so-called flick wipe operation. The object of the electronic circuit is to utilize the flick-wipe position to select either flick-wipe operation or intermittent operation according to the length of time for which the operating member is held in the flick-wipe position.

The input circuit (which consists of transistors $T_1$, $T_2$ and $T_5$, resistors $R_1$, $R_3$, diodes $D_1$, $D_2$, $D_3$ and external resistors $ER_2$ and $ER_3$) is intended to ensure that transistor $T_5$ is turned off (via $D_2$) whenever contact SC2 is closed. In the alternative connection mode referred to the switch contacts and resistors $ER_2$ and $ER_3$ are connected between pin 13 and rail 21 so that when thus connected closure of the switch contacts SC2 cause turning on of transistor $T_2$ to turn off the transistor $T_5$. It will be noted that by virtue of diode $D_3$ closing of switch contact SC2 turns on transistor $T_{55}$ and thus transistors $T_{57}$ and $T_{58}$ are turned on thereby. In the alternative connection mode turning on of transistor $T_2$ has the same effect.

The electronic switch (which consists of transistor $T_{30}$ and resistor $R_{12}$) is arranged to be turned off whenever transistor $T_5$ is off.

The timing circuit consists of transistors $T_6$ to $T_{14}$, $T_{16}$ and $T_{17}$, resistors $R_4$, $R_5$ and $R_8$ and external components $ER_4$ and $C_1$. Capacitor $C_1$ is charged by the current sink constituted by transistors $T_6$, $T_7$ and $T_9$ together with the current-determining resistor $ER_4$. Capacitor $C_1$ is held discharged by transistors $T_5$ and $T_8$ until the switch contacts close and turn transistor $T_8$ off. When the voltage on capacitor $C_1$ reaches the voltage reference defined by resistors $R_{18}$, $R_{19}$, $R_{20}$ and $T_{41}$, the comparator constituted by transistors $T_{10}$ to $T_{14}$ and $T_{16}$ changes state and transistor $T_{17}$ is switched on. Transistor $T_{17}$ overrides all other transistors connected to capacitor $C_2$ and holds it discharged. This prevents the oscillator constituted by transistor $T_{42}$ to $T_{54}$, resistors $R_{22}$ to $R_{24}$ and $R_{28}$ and external components $ER_6$ and $C_4$, from switching the output. As soon as the switch contacts open the transistor $T_8$ again clamps capacitor $C_1$ discharged and transistor $T_{17}$ turns off.

The master flip-flop is constituted by transistors $T_3$, $T_{15}$, $T_{18}$ to $T_{28}$ and $T_{33}$, resistors $R_2$, $R_6$, $R_7$, $R_9$, $R_{10}$ and $R_{11}$ and the capacitor $C_2$. Capacitor $C_2$ is charged by means of the current sink constituted by transistors $T_3$, $T_{15}$ and $T_{18}$ and is discharged by the current source constituted by the transistors $T_{19}$ and $T_{21}$ (unless transistor $T_{17}$ is on). The current provided by transistor $T_{19}$ is three times that provided by transistor $T_{18}$, so that only transistor $T_{19}$ need be switched on or off in order to charge and discharge the capacitor $C_2$ (ignoring, for the moment, the effect of transistor $T_{17}$). The remainder of the master flip-flop comprises a voltage comparator consisting of transistor $T_{23}$ to $T_{28}$, an output transistor $T_{33}$ and input logic constituted by transistors $T_{20}$ and $T_{22}$.

Transistors $T_{20}$ and $T_{22}$ control the transistor $T_{19}$ and these receive inputs from the master flip-flop output transistor $T_{33}$, the slave flip-flop output transistor $T_{37}$ and the input circuit transistors $T_2$ and $T_5$. When the switch contacts are open the transistor $T_{22}$ is held off by transistor $T_5$ and transistor $T_{20}$ is controlled by transistor $T_{33}$. Thus the condition of transistor $T_{19}$ is controlled only by the state of the voltage comparator consisting of transistors $T_{23}$ to $T_{28}$ and a positive feedback loop exists on the master flip-flop output back to its input. This maintains the state of the flip-flop, that is if the capacitor voltage is above the reference voltage, transistors $T_{23}$ and $T_{24}$ are on, transistor $T_{25}$ is off, transistor $T_{33}$ is on, transistor $T_{20}$ is off and transistor $T_{19}$ is allowed to mirror current and maintain the capacitor voltage above the reference. The opposite is also true and so, whenever the switch contacts are open, the master flip-flop retains its existing state.

The slave flip-flop consists of transistors $T_{29}$, $T_{31}$ $T_{32}$ and $T_{34}$ to $T_{40}$ resistors $R_{13}$ to $R_{17}$ and the external capacitor $C_3$. The capacitor $C_3$ is charged by means of a current sink constituted by transistors $T_{29}$ and $T_{31}$ and is discharged by a current source consisting of transistors $T_{32}$ and $T_{34}$. Once again, the current provided by transistor $T_{32}$ is three times that provided by transistor $T_{31}$. The current levels are both derived from the current passing through the resistor $R_{13}$ which is supplied current by transistor $T_{30}$. Transistor $T_{30}$ is off whenever the switch contacts are closed and so neither transistor $T_{31}$ nor transistor $T_{32}$ can supply current to alter the voltage on capacitor $C_3$. Thus, only leakages, and the input current to the transistor $T_{35}$ affect the voltage on capacitor $C_3$ and the slave flip-flop retains its state for at least a predetermined period while the switch contacts are closed. The remainder of the slave flip-flop consists of a voltage comparator consisting of transistors $T_{35}$ to $T_{40}$.

When the switch contacts are open the state of the slave flip-flop is controlled by the output of the master flip-flop transistor $T_{33}$ which controls current mirror transistor $T_{32}$. With the switch contacts open, whenever capacitor $C_2$ is charged, capacitor $C_3$ becomes discharged and vice verse and hence the state of the slave flip-flop represents that of the master flip-flop.

When the contacts close the transistor $T_{20}$ is held off by diode $D_2$, and the transistor $T_{22}$ is controlled by the output of the slave flip-flop transistor $T_{37}$. Thus, control of the currents feeding master flip-flop capacitor $C_2$ passes to the slave flip-flop which, while the contacts are closed, is storing the state that the master flip-flop had, prior to the contacts closing.

Under these conditions, the transistor $T_{22}$ is switched such that if the previous state of capacitor $C_2$ was charged then it now becomes discharged and vice versa. Hence the master flip-flop takes up the state opposite to its previous one. The output of the master flip-flop transistor $T_{33}$ controls the output of the oscillator $T_{54}$ and only allows the output to be intermittently switched on when transistor $T_{33}$ is off.

The output is also switched on, regardless of the state of the circuit, whenever a switch, connected to the circuit by pin 12, is closed. Also, over voltage protection circuit consisting of transistor $T_{56}$ and the external resistors $ER_7$ and $ER_8$ switches the output on whenever the supply voltage exceeds a certain value (so as to protect the transistors in the circuit from over voltage).

The current levels, capacitor values and voltage excursions define the time delays of the circuit which provide the required switch bounce rejection. Also, since the capacitor voltages define the states of the flip-flops, then the circuit does not rapidly lose its stored information due to interference and transient supply interruptions.

I claim:

1. A d.c.-triggered master-slave flip-flop circuit for operation in conjunction with a signal source, said circuit comprising:

a master flip-flop circuit having an input and an output, the voltage at said input determining the state of the master flip-flop circuit;

means providing positive feedback from the output to the input of the master flip-flop circuit;

slave circuit means, having an input and an output, for alternatively connecting said signal source and said output of said slave circuit means to said master flip-flop circuit input;

means connecting said input of said slave circuit means to said output of said master flip-flop circuit;

capacitive delay means, connected to the input of each of the master flip-flop circuit and the slave circuit means, for rendering the master flip-flop circuit and the slave circuit means immune to noise pulses and unintended multiple triggering;

wherein each of the master flip-flop circuit and the slave circuit means includes a d.c. input and incorporates current source means controllable by the d.c. input to charge and discharge the associated capacitive delay means; and comparator means connected to compare the voltage on said capacitive delay means with a reference voltage.

2. A flip-flop circuit as claimed in claim 1 in which said current source means comprises a constant current sink circuit providing a constant charging current for the associated capacitive delay means, and a switchable constant current source circuit controlled by the d.c. input and providing when operative a constant discharging current for said associated capacitive delay means.

* * * * *